(12) United States Patent
Yuan

(10) Patent No.: US 10,726,786 B2
(45) Date of Patent: Jul. 28, 2020

(54) PIXEL COMPENSATION CIRCUIT, METHOD FOR DRIVING THE SAME, DISPLAY PANEL, AND DISPLAY DEVICE

(71) Applicant: BOE Technology Group Co., Ltd., Beijing (CN)

(72) Inventor: Lijun Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/138,218

(22) Filed: Sep. 21, 2018

(65) Prior Publication Data

US 2019/0172395 A1 Jun. 6, 2019

(30) Foreign Application Priority Data

Dec. 1, 2017 (CN) .......................... 2017 1 1250376

(51) Int. Cl.
*G09G 3/3258* (2016.01)
*G09G 3/3266* (2016.01)
*G09G 3/3291* (2016.01)
*G09G 3/3233* (2016.01)
*H01L 27/32* (2006.01)

(52) U.S. Cl.
CPC ......... *G09G 3/3258* (2013.01); *G09G 3/3233* (2013.01); *G09G 3/3266* (2013.01); *G09G 3/3291* (2013.01); *G09G 2300/043* (2013.01); *G09G 2300/0426* (2013.01); *G09G 2300/0439* (2013.01); *G09G 2300/0819* (2013.01); *G09G 2300/0842* (2013.01); *G09G 2310/0251* (2013.01); *G09G 2320/0233* (2013.01); *H01L 27/3244* (2013.01)

(58) Field of Classification Search
CPC .. G09G 3/3258; G09G 3/3233; G09G 3/3266; G09G 3/3291; G09G 2310/0251; G09G 2300/0842; G09G 2300/043; G09G 2300/0819; G09G 2300/0439; G09G 2300/0426; G09G 2320/0233; G09G 3/3208; H01L 27/3244
See application file for complete search history.

(56) References Cited

U.S. PATENT DOCUMENTS

2013/0063498 A1* 3/2013 Yabukane ............ G09G 3/3225
345/690

* cited by examiner

*Primary Examiner* — Mark W Regn
(74) *Attorney, Agent, or Firm* — Arent Fox LLP; Michael Fainberg

(57) ABSTRACT

A pixel compensation circuit includes: an initialization sub-circuit, a data writing sub-circuit, a storage sub-circuit, a compensation sub-circuit, a driving sub-circuit, a light-emission control sub-circuit, and a light-emitting element. Since the sub-circuits operate in cooperation with each other only under the control of the gate scan signal terminal and the reset signal terminal so that operating current of the light-emitting element isn't affected by threshold voltage of the driver sub-circuit.

10 Claims, 6 Drawing Sheets

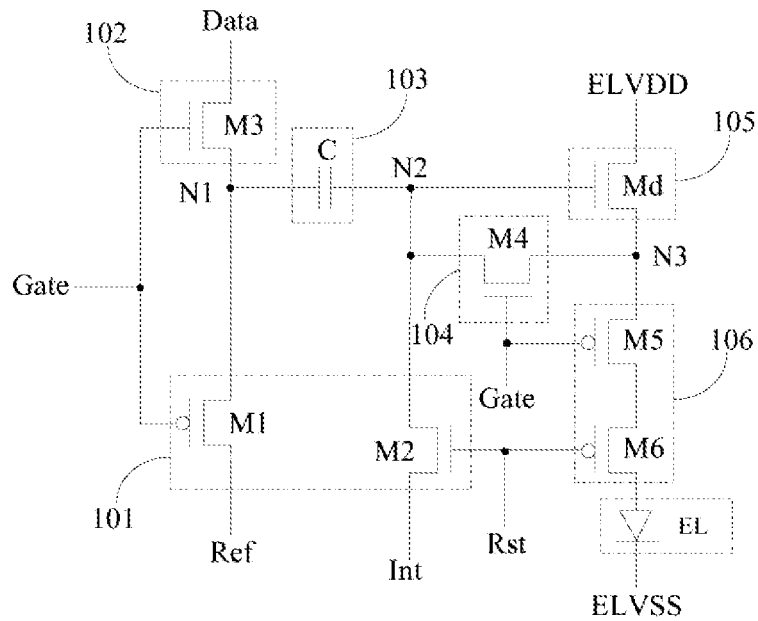

Fig.2B

| In an initialization period, the gate scan signal terminal and the reset signal terminal respectively provide the initialization sub-circuit with an enabling signal to enable the signal of the reference signal terminal to be written into the first node, and the signal of the initialization signal terminal to be written into the second node | ─ 301 |

| In a charging period, the gate scan signal terminal provides the data writing sub-circuit and the compensation sub-circuit respectively with enabling signals to enable the signal of the data signal terminal to be written into the first node, and the threshold voltage of the driver sub-circuit to be written into the second node | ─ 302 |

| In a light-emission period, the gate scan signal terminal provides the initialization sub-circuit t with an enabling signal to enable the signal of the reference signal terminal to be written into the first node; and the gate scan signal terminal and the reset signal terminal respectively provide the light-emission control sub-circuit with an enabling signal to enable the light-emitting element to emit light | ─ 303 |

Fig.3

PIXEL COMPENSATION CIRCUIT, METHOD FOR DRIVING THE SAME, DISPLAY PANEL, AND DISPLAY DEVICE

CROSS-REFERENCES TO RELATED APPLICATIONS

This application claims priority to Chinese patent application No. 201711250376.8 filed on Dec. 1, 2017, which is incorporated herein by reference in its entirety.

FIELD

The present disclosure relates to the field of display technologies, and particularly to a pixel compensation circuit, a method for driving the same, a display panel, and a display device.

BACKGROUND

With the popularization of the Internet and the continuous development of display technologies, a display panel with a high quality has become an important feature of numerous electronic consumer products. An Organic Light-Emitting Diode (OLED) display panel has the advantages of self-luminescence, lower energy consumption, a lower production cost, a wider angle of view, higher contrast, a higher response speed, more realistic color rendering, being easier to be made light-weighted, thinned, and flexible, etc., compared with a Liquid Crystal Display (LCD). At present, the organic light-emitting diode display panel has come to take the place of the traditional liquid crystal display panel in the display field of mobile phones, digital cameras, computes, personal digital assistants, etc., and is expected to be a predominate option of the next generation of display panel.

SUMMARY

In an aspect, an embodiment of the disclosure provides a pixel compensation circuit. The pixel compensation circuit includes an initialization sub-circuit, a data writing sub-circuit, a storage sub-circuit, a compensation sub-circuit, a driving sub-circuit, a light-emission control sub-circuit, and a light-emitting element, wherein the initialization sub-circuit has a first control terminal connected with a gate scan signal terminal, a second control terminal connected with a reset signal terminal, a first input terminal connected with a reference signal terminal, a second input terminal connected with an initialization signal terminal, a first output terminal connected with a first node, and a second output terminal connected with a second node; and the initialization sub-circuit is configured to write a signal of the reference signal terminal into the first node under the control of the gate scan signal terminal, and to write a signal of the initialization signal terminal into the second node under the control of the reset signal terminal; the data writing sub-circuit has a control terminal connected with the gate scan signal terminal, an input terminal connected with a data signal terminal, and an output terminal connected with the first node; and the data writing sub-circuit is configured to write a signal of the data signal terminal into the first node under the control of the gate scan signal terminal; the storage sub-circuit has one terminal connected with the first node, and the other terminal connected with the second node; and the storage sub-circuit is configured to write a difference between the signal of the reference signal terminal and the signal of the data signal terminal into the second node; the compensation sub-circuit has a control terminal connected with the gate scan signal terminal, a first terminal connected with a third node, and a second terminal connected with the second node; and the compensation sub-circuit is configured to write a threshold voltage of the driver sub-circuit into the second node; and the driver sub-circuit has a control terminal connected with the second node, an input terminal connected with a first power supply terminal, and an output terminal connected with the third node; the light-emission control sub-circuit has a first control terminal connected with the gate scan signal terminal, a second control terminal connected with the reset signal terminal, an input terminal connected with the third node, and an output terminal connected with one terminal of the light-emitting element, and the light-emitting element has the other terminal connected with a second power supply terminal; and the driver sub-circuit is configured, under the control of the second node, to drive the light-emitting element to emit light through the turned-on light-emission control sub-circuit.

In a possible implementation, in the pixel compensation circuit above according to the embodiment of the disclosure, the initialization sub-circuit includes a first switch transistor and a second switch transistor, wherein the first switch transistor has a gate connected with the gate scan signal terminal, a first electrode connected with the reference signal terminal, and a second electrode connected with the first node; and the second switch transistor has a gate connected with the reset signal terminal, a first electrode connected with the initialization signal terminal, and a second electrode connected with the second node.

In a possible implementation, in the pixel compensation circuit above according to the embodiment of the disclosure, the data writing sub-circuit includes a third switch transistor. The third switch transistor has a gate connected with the gate scan signal terminal, a first electrode connected with the data signal terminal, and a second electrode connected with the first node.

In a possible implementation, in the pixel compensation circuit above according to the embodiment of the disclosure, the storage sub-circuit includes a capacitor. The capacitor has one terminal connected with the first node, and the other terminal connected with the second node.

In a possible implementation, in the pixel compensation circuit above according to the embodiment of the disclosure, the compensation sub-circuit includes a fourth switch transistor. The fourth switch transistor has a gate connected with the gate scan signal terminal, a first electrode connected with the third node, and a second electrode connected with the second node.

In a possible implementation, in the pixel compensation circuit above according to the embodiment of the disclosure, the driver sub-circuit includes a driver transistor. The driver transistor has a gate connected with the second node, a first electrode connected with the first power supply terminal, and a second electrode connected with the third node.

In a possible implementation, in the pixel compensation circuit above according to the embodiment of the disclosure, the light-emission control sub-circuit includes: a fifth switch transistor and a sixth switch transistor. The fifth switch transistor has a gate connected with the gate scan signal terminal, a first electrode connected with the third node, and a second electrode connected with a first electrode of the sixth switch transistor; and the sixth switch transistor has a gate connected with the reset signal terminal, and a second electrode connected with one terminal of the light-emission element.

In a possible implementation, in the pixel compensation circuit above according to the embodiment of the disclosure, the first switch transistor, the fifth switch transistor, and the sixth switch transistor are N-type transistors, and the second switch transistor, the third switch transistor, the fourth switch transistor, and the driver transistor are P-type transistors; or, the first switch transistor, the fifth switch transistor, and the sixth switch transistor are P-type transistors, and the second switch transistor, the third switch transistor, the fourth switch transistor, and the driver transistor are N-type transistors.

In another aspect, an embodiment of the disclosure further provides a display panel including a gate driver, and the pixel compensation circuit above.

In still another aspect, an embodiment of the disclosure further provides a display device including the display panel above.

In further another aspect, an embodiment of the disclosure further provides a method for driving the pixel compensation circuit above. The method including: in an initialization period, providing respectively, by the gate scan signal terminal and the reset signal terminal, the initialization sub-circuit with an enabling signal to enable the signal of the reference signal terminal to be written into the first node, and the signal of the initialization signal terminal to be written into the second node; in a charging period, providing, by the gate scan signal terminal, the data writing sub-circuit and the compensation sub-circuit respectively with enabling signals to enable the signal of the data signal terminal to be written into the first node, and the threshold voltage of the driver sub-circuit to be written into the second node; and in a light-emission period, providing, by the gate scan signal terminal, the initialization sub-circuit with an enabling signal to enable the signal of the reference signal terminal to be written into the first node; and providing respectively, by the gate scan signal terminal and the reset signal terminal, the light-emission control sub-circuit with an enabling signal to enable the light-emitting element to emit light.

BRIEF DESCRIPTION OF THE DRAWINGS

FIG. 2A and FIG. 2B are schematic structural diagrams of the pixel compensation circuit according to the embodiment of the disclosure;

FIG. 3 is a flow chart of a method for driving the pixel compensation circuit according to the embodiment of the disclosure;

DETAILED DESCRIPTION

Implementations of the pixel compensation circuit, the method for driving the same, the display panel, and the display device according to the embodiments of the disclosure will be described below in details with reference to the drawings. It shall be noted that the embodiments described in the specification are only a part but not all of the embodiments of the disclosure, and the embodiments of the disclosure and the features in the embodiments can be combined with each other unless they conflict with each other. Furthermore based upon the embodiments here of the disclosure, all the other embodiments which can occur to those ordinarily skilled in the art without any inventive effort shall fall into the claimed scope of the disclosure.

Unlike the liquid crystal display panel of which the luminance is controlled using stable voltage, the organic light-emitting diode display panel is driven by the current, and should be controlled using stable current to emit light. The luminance of light emitted by the organic light-emitting diode display panel is sensitive to a variation of the driving current thereof, and the driving current varies with varying of threshold voltage of a driver transistor for driving a light-emitting element to emit light, so that the luminance varies, thus degrading the uniformity of luminance of the display panel.

In order to improve the uniformity of luminance of the display panel, threshold voltage of a driver transistor is generally compensated using a pixel compensation circuit in the related art. Specifically driver signals of the pixel compensation circuit generally include a gate scan signal and a reset signal provided by a gate driver (Gate-GOA), and a light-emission control signal provided by a light-emission controller (EMS-GOA). However both the Gate-GOA and the EMS-GOA are arranged at a border of the display panel, thus making the border relatively wide.

Embodiments of the disclosure provide a pixel compensation circuit, a method for driving the same, a display panel, and a display device so as to provide the display panel with a narrow border.

Figure 1:
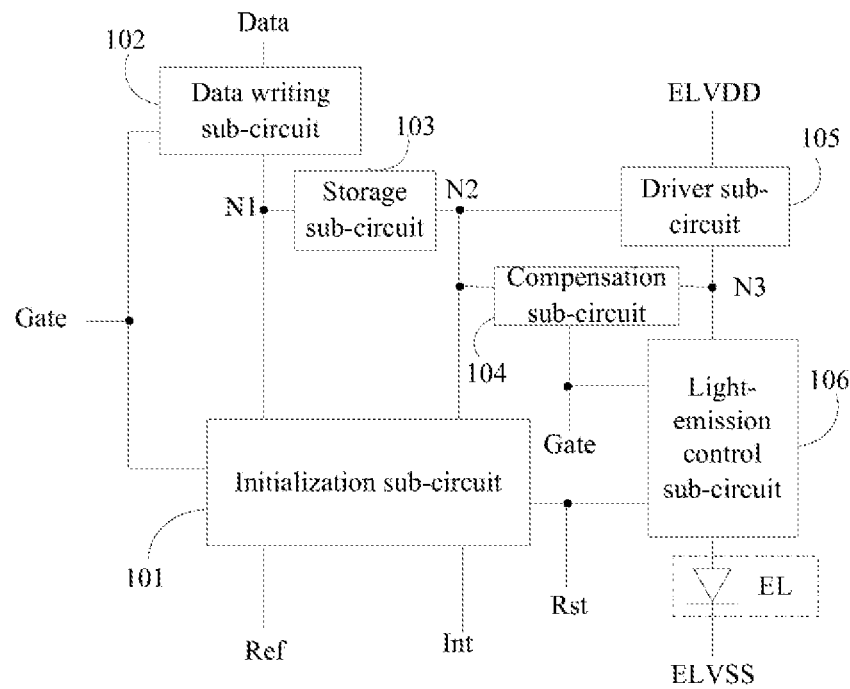
FIG. 1 is a schematic structural diagram of a pixel compensation circuit according to an embodiment of the disclosure.
Figure 2A:
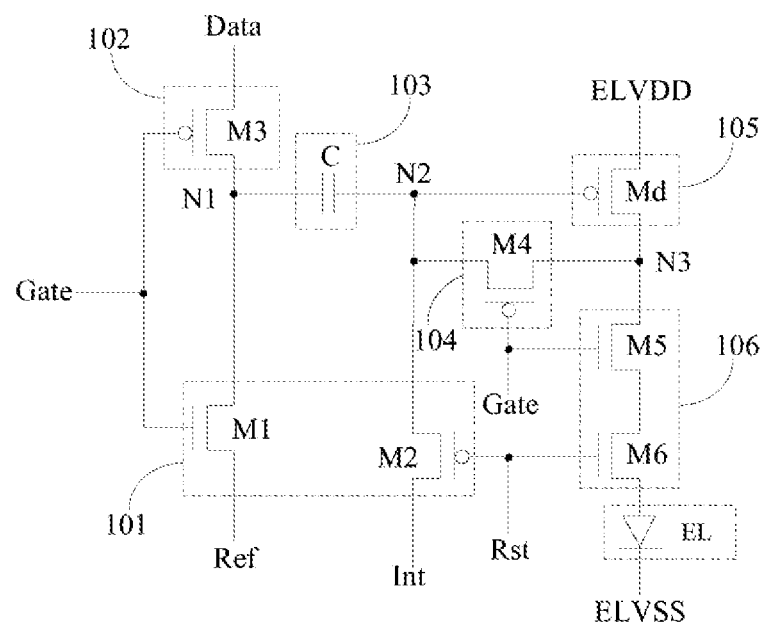

An embodiment of the disclosure provides a pixel compensation circuit. As illustrated in FIG. 1, FIG. 2A, and FIG. 2B, the pixel compensation circuit includes an initialization sub-circuit 101, a data writing sub-circuit 102, a storage sub-circuit 103, a compensation sub-circuit 104, a driving sub-circuit 105, a light-emission control sub-circuit 106, and a light-emitting element EL.

The initialization sub-circuit 101 has a first control terminal connected with a gate scan signal terminal Gate, a second control terminal connected with a reset signal terminal Rst, a first input terminal connected with a reference signal terminal Ref, a second input terminal connected with an initialization signal terminal Int, a first output terminal connected with a first node N1, and a second output terminal connected with a second node N2; and the initialization sub-circuit 101 is configured to write a signal of the reference signal terminal Ref into the first node N1 under the control of the gate scan signal terminal Gate, and to write a signal of the initialization signal terminal Int into the second node N2 under the control of the reset signal terminal Rst.

The data writing sub-circuit 102 has a control terminal connected with the gate scan signal terminal Gate, an input terminal connected with a data signal terminal Data, and an output terminal connected with the first node N1; and the data writing sub-circuit 102 is configured to write a signal of the data signal terminal Data into the first node under the control of the gate scan signal terminal Gate.

The storage sub-circuit 103 has one terminal connected with the first node N1, and the other terminal connected with the second node N2; and the storage sub-circuit 103 is configured to write a difference between the signal of the reference signal terminal Ref and the signal of the data signal terminal Data into the second node N2.

The compensation sub-circuit 104 has a control terminal connected with the gate scan signal terminal Gate, a first terminal connected with a third node N3, and a second terminal connected with the second node N2; and the compensation sub-circuit 104 is configured to write threshold voltage $V_{th}$ of the driver sub-circuit 105 into the second node N2.

The driver sub-circuit 105 has a control terminal connected with the second node N2, an input terminal connected with a first power supply terminal ELVDD, and an output terminal connected with the third node N3; the light-emission control sub-circuit 106 has a first control terminal connected with the gate scan signal terminal Gate, a second control terminal connected with the reset signal terminal Rst, an input terminal connected with the third node N3, and an output terminal connected with one terminal with the light-emitting element EL, and the light-emitting element EL has the other terminal connected with a second power supply terminal ELVSS; and the driver sub-circuit 105 is configured, under the control of the second node N2, to drive the light-emitting element EL to emit light through the turned-on light-emission control sub-circuit 106.

In the pixel compensation circuit above according to the embodiment of the disclosure, since the sub-circuits operate in cooperation with each other only under the control of the gate scan signal terminal Gate and the reset signal terminal Rst so that operating current of the light-emitting element EL isn't affected by the threshold voltage $V_{th}$ of the driver sub-circuit 105, thus only a gate driver (Gate-GOA) providing driver signals to the gate scan signal terminal Gate and the reset signal terminal Rst, but no light-emission controller (EMS-GOA) are arranged at a border, thus realizing a design of the narrow border. Furthermore only a gate scan signal line and a reset signal line, but no light-emission control signal line is designed accordingly, thus improving the resolution of the display panel.

It shall be noted that in an implementation, in the pixel compensation circuit above according to the embodiment of the disclosure, signal voltage of the first power supply terminal ELVDD is typically high voltage, and signal voltage of the second power supply terminal ELVSS is typically low voltage or ground. In a real application, the signal voltage of the first power supply terminal ELVDD and the second power supply terminal ELVSS will be designed and determined as needed in a real application environment, although the embodiment of this disclosure will not be limited thereto.

The disclosure will be described below in details in connection with embodiments thereof. It shall be noted that the embodiments are only intended to better illustrate the disclosure, but not to limit the disclosure thereto.

Specifically in the pixel compensation circuit above according to the embodiment of the disclosure, as illustrated in FIG. 2A and FIG. 2B, the initialization sub-circuit 101 includes: a first switch transistor M1 and a second switch transistor M2.

The first switch transistor M1 has a gate connected with the gate scan signal terminal Gate, a first electrode connected with the reference signal terminal Ref, and a second electrode connected with the first node N1.

The second switch transistor M2 has a gate connected with the reset signal terminal Rst, a first electrode connected with the initialization signal terminal Int, and a second electrode connected with the second node N2.

In an implementation, in the pixel compensation circuit above according to the embodiment of the disclosure, the first switch transistor M1 is turned on under the control of the gate scan signal terminal Gate, and the signal of the reference signal terminal Ref is written into the first node N1 through the turned-on first switch transistor M1; and the second switch transistor M2 is turned on under the control of the reset signal terminal Rst, and the signal of the initialization signal terminal Int is written into the second node N2 through the turned-on second switch transistor M2.

The structure above of the initialization sub-circuit 101 in the pixel compensation circuit has only been described by way of an example, and in the implementation, the specific structure of the initialization sub-circuit 101 will not be limited to the structure above according to the embodiment of the disclosure, but can alternatively be another structure known to those skilled in the art, although the embodiment of this disclosure will not be limited thereto.

In some embodiments, in the pixel compensation circuit above according to the embodiment of the disclosure, as illustrated in FIG. 2A and FIG. 2B, the data writing sub-circuit 102 includes a third switch transistor M3.

The third switch transistor M3 has a gate connected with the gate scan signal terminal Gate, a first electrode connected with the data signal terminal Data, and a second electrode connected with the first node N1.

In an implementation, in the pixel compensation circuit above according to the embodiment of the disclosure, the third switch transistor M3 is turned on under the control of the gate scan signal terminal Gate, and the signal of the data signal terminal Data is written into the first node N1 through the turned-on third switch transistor M3.

The structure above of the data writing sub-circuit 102 in the pixel compensation circuit has only been described by way of an example, and in the implementation, the specific structure of the data writing sub-circuit 102 will not be limited to the structure above according to the embodiment of the disclosure, but can alternatively be another structure known to those skilled in the art, although the embodiment of this disclosure will not be limited thereto.

In some embodiments, in the pixel compensation circuit above according to the embodiment of the disclosure, as illustrated in FIG. 2A and FIG. 2B, the storage sub-circuit 103 includes a capacitor C.

The capacitor C has one terminal connected with the first node N1, and the other terminal connected with the second node N2.

In an implementation, in the pixel compensation circuit above according to the embodiment of the disclosure, the first switch transistor M1 is turned on under the control of the gate scan signal terminal Gate, and the signal of the reference signal terminal Ref is written into the first node N1 through the turned-on first switch transistor M1, so that the voltage at the terminal of the capacitor C connected with the first node N1 is changed from the signal of the data signal terminal Data to the signal of the reference signal terminal Ref, and since the total amount of charges in the capacitor C remains unchanged, the voltage at the other terminal of the capacitor C connected with the second node N2 is changed accordingly, that is, the capacitor C writes the difference between the signal of the reference signal terminal Ref and the signal of the data signal terminal Data into the second node N2.

The structure above of the storage sub-circuit 103 in the pixel compensation circuit has only been described by way of an example, and in the implementation, the specific structure of the storage sub-circuit 103 will not be limited to the structure above according to the embodiment of the disclosure, but can alternatively be another structure known to those skilled in the art, although the embodiment of this disclosure will not be limited thereto.

In some embodiments, in the pixel compensation circuit above according to the embodiment of the disclosure, as illustrated in FIG. 2A and FIG. 2B, the compensation sub-circuit 104 includes a fourth switch transistor M4.

The fourth switch transistor M4 has a gate connected with the gate scan signal terminal Gate, a first electrode connected with the third node N3, and a second electrode connected with the second node N2.

In an implementation, in the pixel compensation circuit above according to the embodiment of the disclosure, the fourth switch transistor M4 is turned on under the control of the gate scan signal terminal Gate, and writes the threshold voltage $V_{th}$ of the driver transistor Md into the second node N2 to compensate for the threshold voltage $V_{th}$ at the gate of the driver transistor Md connected with the second node N2.

The structure above of the compensation sub-circuit 104 in the pixel compensation circuit has only been described by way of an example, and in an implementation, the specific structure of the compensation sub-circuit 104 will not be limited to the structure above according to the embodiment of the disclosure, but can alternatively be another structure known to those skilled in the art, although the embodiment of this disclosure will not be limited thereto.

In some embodiments, in the pixel compensation circuit above according to the embodiment of the disclosure, as illustrated in FIG. 2A and FIG. 2B, the driver sub-circuit 105 includes a driver transistor Md; and the light-emission control sub-circuit 106 includes a fifth switch transistor M5 and a sixth switch transistor M6.

The driver transistor Md has a gate connected with the second node N2, a first electrode connected with the first power supply terminal ELVDD, and a second electrode connected with the third node N3.

The fifth switch transistor M5 has a gate connected with the gate scan signal terminal Gate, a first electrode connected with the third node N3, and a second electrode connected with a first electrode of the sixth switch transistor M6.

The sixth switch transistor M6 has a gate connected with the reset signal terminal Rst, and a second electrode connected with one terminal of the light-emission element EL.

In an implementation, in the pixel compensation circuit above according to the embodiment of the disclosure, the fifth switch transistor M5 is turned on under the control of the gate scan signal terminal Gate, and the sixth switch transistor M6 is turned on under the control of the reset signal terminal Rst. The driver transistor Md, of which the threshold voltage Vth has been compensated, drives the light-emitting element EL to emit light through the turned-on fifth switch transistor M5 and the turned-on sixth switch transistor M6.

The structures above of the fifth switch transistor M5 and the sixth switch transistor M6 in the pixel compensation circuit has only been described by way of an example, and in the implementation, the specific structures of the fifth switch transistor M5 and the sixth switch transistor M6 will not be limited to the structure above according to the embodiment of the disclosure, but can alternatively be other structures known to those skilled in the art, although the embodiment of this disclosure will not be limited thereto.

It shall be noted that in the implementation, in the pixel compensation circuit above according to the embodiment of the disclosure, the light-emitting element EL can be an Organic Light-Emitting Diode (OLED); or the light-emitting element EL can be a Quantum dot Light-Emitting Diode (QLED). In a real application, the specific structure of the light-emitting element EL will be designed and determined as needed in a real application environment, although the embodiment of this disclosure will not be limited thereto.

Furthermore the respective transistors as referred to in the embodiment above of the disclosure can be Thin Film Transistors (TFTs), or can be Metal Oxide Semiconductors (MOS's), although the embodiment of this disclosure will not be limited thereto. The embodiment of the disclosure has been and will be described by way of an example in which the transistors are metal oxide semiconductor field effect transistors.

Furthermore the first and second electrodes of the transistors as referred to in the embodiment above of the disclosure are sources and drains, but in the implementation, the sources and the drains of these transistors can be replaced with each other, although the embodiment of this disclosure will not be limited thereto.

Furthermore in the pixel compensation circuit above according to the embodiment of the disclosure, as illustrated in FIG. 2A, the first switch transistor M1, the fifth switch transistor M5, and the sixth switch transistor M6 can be N-type transistors, and the second switch transistor M2, the third switch transistor M3, the fourth switch transistor M4, and the driver transistor Md can be P-type transistors.

Alternatively, as illustrated in FIG. 2B, the first switch transistor M1, the fifth switch transistor M5, and the sixth switch transistor M6 can be P-type transistors, and the second switch transistor M2, the third switch transistor M3, the fourth switch transistor M4, and the driver transistor Md can be N-type transistors.

Correspondingly an embodiment of the disclosure further provides a method for driving the pixel compensation circuit above. As illustrated in FIG. 3, the method includes the following steps.

In S301, in an initialization period, the gate scan signal terminal and the reset signal terminal respectively provides the initialization sub-circuit with an enabling signal to enable the signal of the reference signal terminal to be written into the first node, and the signal of the initialization signal terminal to be written into the second node.

In S302, in a charging period, the gate scan signal terminal provides the data writing sub-circuit and the compensation sub-circuit respectively with enabling signals to enable the signal of the data signal terminal to be written into the first node, and the threshold voltage of the driver sub-circuit to be written into the second node.

In S303, in a light-emission period, the gate scan signal terminal provides the initialization sub-circuit with an enabling signal, to enable the signal of the reference signal terminal to be written into the first node; and the gate scan signal terminal and the reset signal terminal respectively provide the light-emission control sub-circuit with an enabling signal, to enable the light-emitting element to emit light.

It shall be noted that in the driving method above according to the embodiment of the disclosure, the enabling signal provided by the gate scan signal terminal is a gate scan signal, and specifically refer to a signal enabling a corresponding sub-circuit; and in a real application, the corresponding sub-circuit can be an N-type or P-type transistor; and for the N-type transistor, the enabling signal is a low-level signal which can turn on the transistor, and for the P-type transistor, the enabling signal is a high-level signal which can turn on the transistor. The enabling signal provided by the reset signal terminal is a reset signal, and specifically refers to a signal enabling the corresponding sub-circuit; and in a real application, the corresponding sub-circuit can be an N-type or P-type transistor; and for the N-type transistor, the enabling signal is a low-level signal which can turn on the transistor, and for the P-type transistor, the enabling signal is a high-level signal which can turn on the transistor.

In order to better understand the technical solution of the disclosure, an operating process of the pixel compensation circuit will be described below in connection with two specific embodiments thereof.

First Embodiment

Figure 4A:
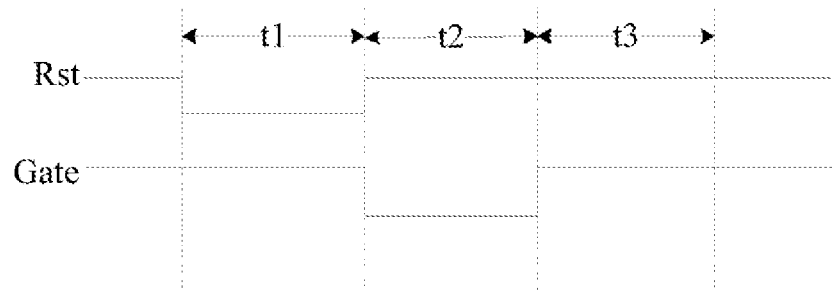
FIG. 4A is an operating timing diagram of the pixel compensation circuit as illustrated in FIG. 2A according to the embodiment of the disclosure.

FIG. 2A is a schematic structural diagram of a pixel compensation circuit according to a first embodiment of the disclosure. In the pixel compensation circuit as illustrated in FIG. 2A, the first switch transistor M1, the fifth switch transistor M5, and the sixth switch transistor M6 are N-channel Metal Oxide Semiconductor Effect Field Transistors (for short, NMOS), and the second switch transistor M2, the third switch transistor M3, the fourth transistor M4, and the driver transistor Md are P-channel Metal Oxide Semiconductor Effect Field Transistors (for short, PMOS). The PMOS transistors are turned on at a low level, and turned off at a high level; and the NMOS transistors are turned on at a high level, and turned off at a low level. FIG. 4A illustrates a corresponding operating timing diagram thereof, and an initialization period t1, a charging period t2, and a light-emission period t3 in the operating timing diagram as illustrated in FIG. 4A will be described in details by way of an example.

In the initialization period t1, the reset signal terminal Rst is at a low level, and the gate scan signal terminal Gate is at a high level.

Figure 5A:
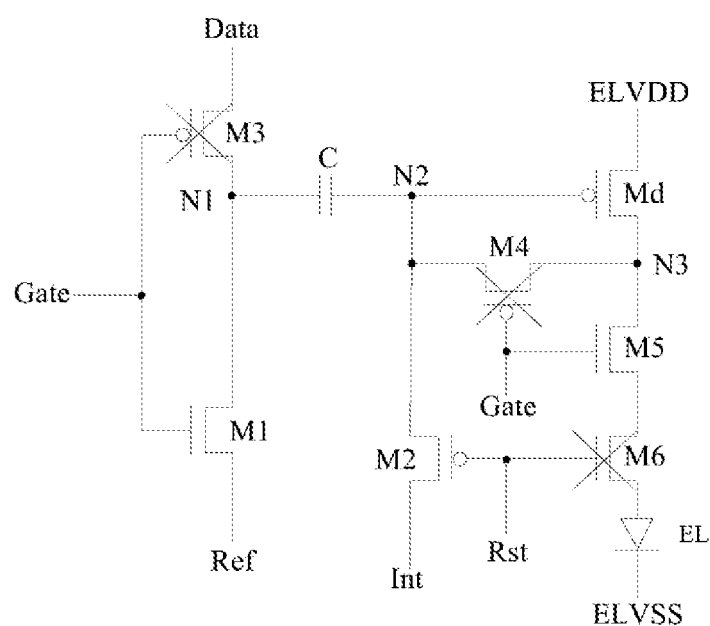
FIG. 5A to FIG. 5C are schematic diagrams of the transistors, which are turned on or off in different periods, of the pixel compensation circuit as illustrated in FIG. 2A according to the embodiment of the disclosure.

The first switch transistor M1, the second switch transistor M2, and the fifth switch transistor M5 are turned on, and the third switch transistor M3, the fourth switch transistor M4, and the sixth switch transistor M6 are turned off, as illustrated in FIG. 5A, where "X" indicates that a transistor is turned off. The signal $V_{ref}$ of the reference signal terminal Ref is written into the first node N1 through the turned-on first switch transistor M1, the signal $V_{int}$ of the initialization signal terminal Int is written into the second node N2 through the turned-on second switch transistor M2, and in order to enable the driver transistor Md to be turned on, the signal $V_{int}$ of the initialization signal terminal Int should be lower than the signal $V_{dd}$ of the first power supply terminal ELVDD.

In the charging period t2, the reset signal terminal Rst is at a high level, and the gate scan signal terminal Gate is at a low level.

Figure 5B:
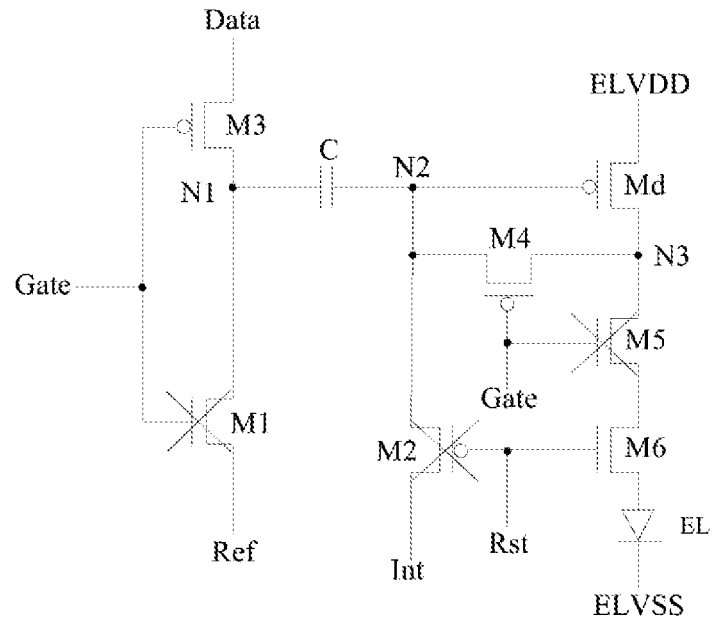

The third switch transistor M3, the fourth switch transistor M4, and the sixth switch transistor M6 are turned on, and the first switch transistor M1, the second switch transistor M2, and the fifth switch transistor M5 are turned off, as illustrated in FIG. 5B. The signal $V_{data}$ of the data signal terminal Data is written into the first node N1 through the turned-on third switch transistor M3; and the fourth switch transistor M4 is turned on so that the gate of the driver transistor Md (i.e., the second node N2) is connected with the drain of the driver transistor Md (i.e., the third node N3), and at this time, the driver transistor Md is equivalent to a diode, and the signal $V_{dd}$ of the first power supply terminal ELVDD is written into the source of the driver transistor Md, and charges the gate (i.e., the second node N2) and the drain (i.e., the third node N3) until the potential of the gate (i.e., the second node N2) and the drain (i.e., the third node N3) becomes $V_{dd}$-$V_{th}$, where $V_{th}$ is the threshold voltage of the driver transistor Md.

In the light-emission period t3, the reset signal terminal Rst is at a high level, and the gate scan signal terminal Gate is at a high level.

Figure 5C:
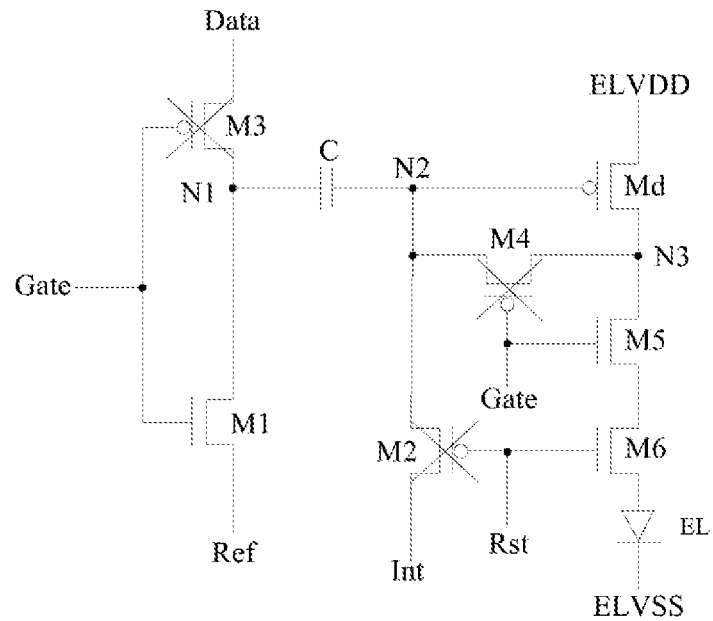

The first switch transistor M1, the fifth switch transistor M5, and the sixth switch transistor M6 are turned on, and the second switch transistor M2, the third switch transistor M3, and the fourth switch transistor M4 are turned off, as illustrated in FIG. 5C. The signal $V_{ref}$ of the reference signal terminal Ref is written into the first node N1 through the turned-on first switch transistor M1, so that the potential of the first node N1 is changed by $V_{ref}$-$V_{data}$; and the total amount of charges in the capacitor remains unchanged, thus the potential of the second node N2 is changed accordingly to $V_{dd}$-$V_{th}$+$V_{ref}$-$V_{data}$, and then the potential at the gate of the driver transistor Md is $V_{dd}$-$V_{th}$+$V_{ref}$-$V_{data}$, the signal $V_{dd}$ of the first power supply terminal ELVDD is converted into current by the turned-on driver transistor Md, and the current is provided to the light-emitting element EL through the turned-on fifth switch transistor M5 and the turned-on sixth transistor M6, to drive the light-emitting element EL to emit light. The operating current $I_{EL}$ driving the light-emitting element EL to emit light is current of the driver transistor Md in a saturated state, specifically as follows:

$$I_{EL} = \frac{K}{2}(V_{sg} - V_{th})^2 = \frac{K}{2}[V_{dd} - (V_{dd} - V_{th} + V_{ref} - V_{data}) - V_{th}]^2 = \frac{K}{2}(V_{data} - V_{ref})^2.$$

Where K=μCox*W/L, μ is the mobility of the driver transistor Md, Cox is gate oxide capacitance per unit area, and W/L is a width to length ratio of the driver transistor Md. As can be apparent, the operating current $I_{EL}$ of the driver transistor Md to drive the light-emitting element EL to emit light is independent of the threshold voltage $V_{th}$ of the driver transistor Md, so that the operating current driving the light-emitting element L can be avoided from being affected by the drifting of threshold voltage $V_{th}$ due to a process of fabricating the driver transistor Md, and a long operating period of time thereof, to thereby maintain the stable operating current of the light-emitting element EL so as to enable the light-emitting element EL to operate normally, thus improving the uniformity of luminance of the display panel.

Second Embodiment

Figure 4B:
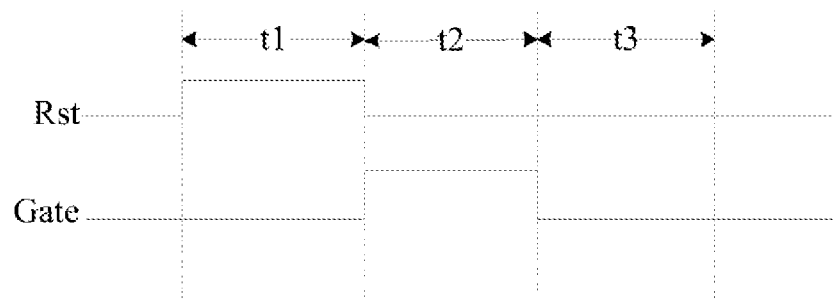
FIG. 4B is an operating timing diagram of the pixel compensation circuit as illustrated in FIG. 2B according to the embodiment of the disclosure.

FIG. 2B is a schematic structural diagram of a pixel compensation circuit according to a second embodiment of the disclosure. In the pixel compensation circuit as illustrated in FIG. 2B, the first switch transistor M1, the fifth switch transistor M5, and the sixth switch transistor M6 are P-channel Metal Oxide Semiconductor Effect Field Transistors (for short, PMOS), and the second switch transistor M2, the third switch transistor M3, the fourth transistor M4, and the driver transistor Md are N-channel Metal Oxide Semiconductor Effect Field Transistors (for short, NMOS), where the PMOS transistors are turned on at a low level, and turned off at a high level; and the NMOS transistors are turned on at a high level, and turned off at a low level. FIG. 4B illustrates a corresponding operating timing diagram thereof, and an initialization period t1, a charging period t2, and a light-emission period t3 in the operating timing diagram as illustrated in FIG. 4B will be described in details by way of an example.

In the initialization period t1, the reset signal terminal Rst is at a high level, and the gate scan signal terminal Gate is at a low level.

Figure 6A:
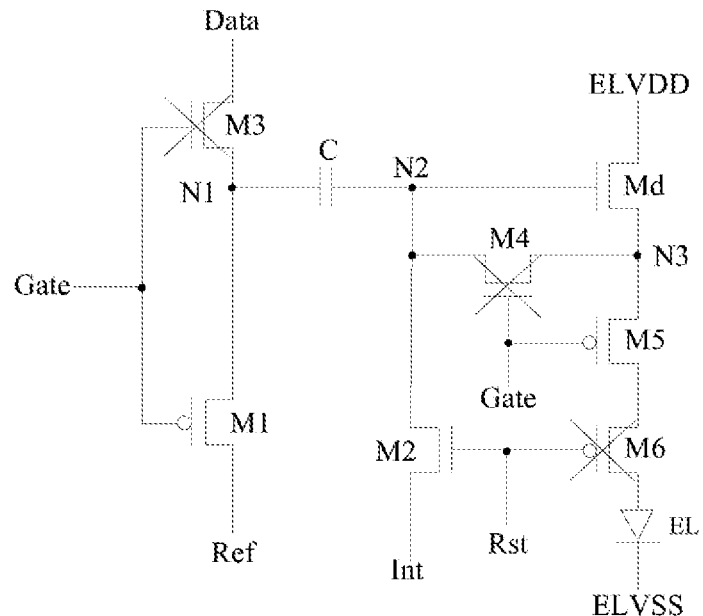
FIG. 6A to FIG. 6C are schematic diagrams of the transistors, which are turned on or off in different periods, of the pixel compensation circuit as illustrated in FIG. 2B according to the embodiment of the disclosure.

The first switch transistor M1, the second switch transistor M2, and the fifth switch transistor M5 are turned on, and the third switch transistor M3, the fourth switch transistor M4, and the sixth switch transistor M6 are turned off, as illustrated in FIG. 6A, where "X" indicates that a transistor is turned off. The signal $V_{ref}$ of the reference signal terminal Ref is written into the first node N1 through the turned-on first switch transistor M1, the signal $V_{int}$ of the initialization signal terminal Int is written into the second node N2 through the turned-on second switch transistor M2, and in order to enable the driver transistor Md to be turned on, the signal $V_{int}$ of the initialization signal terminal Int should be higher than the signal $V_{dd}$ of the first power supply terminal ELVDD.

In the charging period t2, the reset signal terminal Rst is at a low level, and the gate scan signal terminal Gate is at a high level.

Figure 6B:
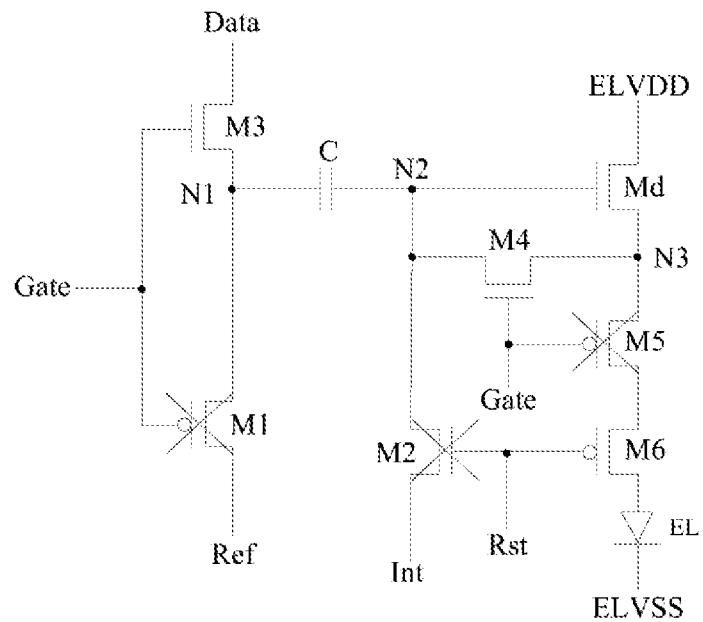

The third switch transistor M3, the fourth switch transistor M4, and the sixth switch transistor M6 are turned on, and the first switch transistor M1, the second switch transistor M2, and the fifth switch transistor M5 are turned off, as illustrated in FIG. 6B. The signal $V_{data}$ of the data signal terminal Data is written into the first node N1 through the turned-on third switch transistor M3; and the fourth switch transistor M4 is turned on so that the gate of the driver transistor Md (i.e., the second node N2) is connected with the drain of the driver transistor (i.e., the third node N3), and at this time, the driver transistor Md is equivalent to a diode, and the signal $V_{dd}$ of the first power supply terminal ELVDD is written into the drain of the driver transistor Md, and charges the gate (i.e., the second node N2) and the drain (i.e., the third node N3) until the potential of the gate (i.e., the second node N2) and the drain (i.e., the third node N3) becomes $V_{dd}+V_{th}$, where $V_{th}$ is the threshold voltage of the driver transistor Md.

In the light-emission period t3, the reset signal terminal Rst is at a low level, and the gate scan signal terminal Gate is at a high level.

Figure 6C:
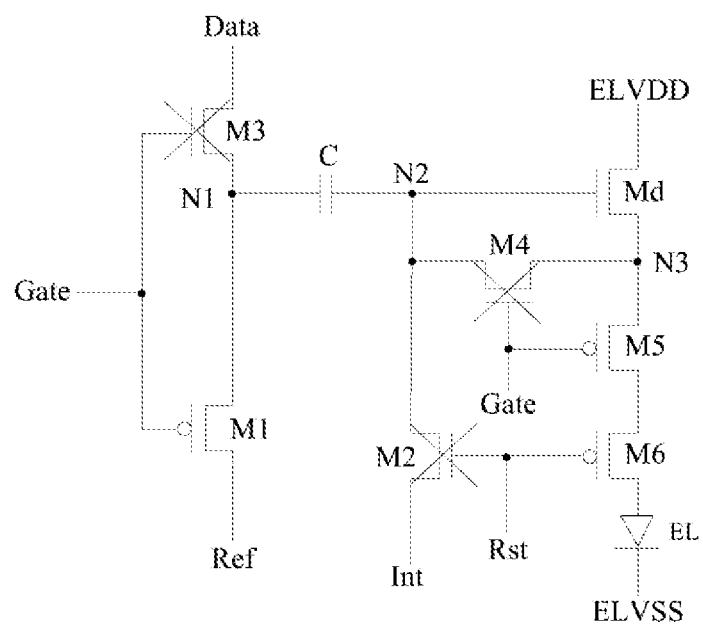

The first switch transistor M1, the fifth switch transistor M5, and the sixth switch transistor M6 are turned on, and the second switch transistor M2, the third switch transistor M3, and the fourth switch transistor M4 are turned off, as illustrated in FIG. 6C. The signal $V_{ref}$ of the reference signal terminal Ref is written into the first node N1 through the turned-on first switch transistor M1, so that the potential of the first node N1 is changed by $V_{ref}-V_{data}$; and the total amount of charges in the capacitor remains unchanged so that the potential of the second node N2 is changed accordingly to $V_{dd}+V_{th}+V_{ref}-V_{data}$, and then the potential at the gate of the driver transistor Md is $V_{dd}+V_{th}+V_{ref}-V_{data}$, the signal $V_{dd}$ of the first power supply terminal ELVDD is converted into current by the turned-on driver transistor Md, and the current is provided to the light-emitting element EL through the turned-on fifth switch transistor M5 and the turned-on sixth transistor M6, to drive the light-emitting element EL to emit light. The operating current $I_{EL}$ driving the light-emitting element EL to emit light is current of the driver transistor Md in a saturated state, specifically as follows:

$$I_{EL} = \frac{K}{2}(V_{gs}-V_{th})^2 =$$

$$\frac{K}{2}[(V_{dd}+V_{th}+V_{ref}-V_{data})-V_{dd}-V_{th}]^2 = \frac{K}{2}(V_{ref}-V_{data})^2.$$

Where K=μCox*W/L, t is the mobility of the driver transistor Md, Cox is gate oxide capacitance per unit area, and W/L is a width to length ratio of the driver transistor Md. As can be apparent, the operating current $I_{EL}$ of the driver transistor Md to drive the light-emitting element EL to emit light is independent of the threshold voltage $V_{th}$ of the driver transistor Md, so that the operating current driving the light-emitting element L can be avoided from being affected by the drifting of threshold voltage $V_{th}$ due to a process of fabricating the driver transistor Md, and a long operating period of time thereof, to thereby maintain the stable operating current of the light-emitting element EL so as to enable the light-emitting element EL to operate normally, thus improving the uniformity of luminance of the display panel.

As can be apparent from the description of the first and second embodiments above, in the technical solution according to the embodiments of the disclosure, the sub-circuits operates in cooperation with each other only under the control of the gate scan signal terminal Gate and the reset signal terminal Rst so that operating current of the light-emitting element EL isn't affected by the threshold voltage $V_{th}$ of the driver transistor Md, thus only a gate driver (Gate-GOA) providing driver signals to the gate scan signal terminal Gate and the reset signal terminal Rst, but no light-emission controller (EMS-GOA) are arranged at a border, thus resulting in a design of the narrow border. Furthermore only a gate scan signal line and a reset signal line, but no light-emission control signal line is designed accordingly, thus improving the resolution of the display panel.

Based upon the same inventive idea, an embodiment of the disclosure provides a display panel including a gate driver, and the pixel compensation circuit above. Furthermore the display panel includes neither a light-emission controller (EMS-GOA) nor a light-emission control signal line, but all the other components indispensable to the display panel shall readily occur to those ordinarily skilled in the art, so a repeated description thereof will be omitted here, and the embodiments of the disclosure will not be limited thereto. Furthermore since the display panel addresses the principle under a similar principle to the pixel compensation circuit above, reference can be made to the implementation of the pixel compensation circuit above according to the embodiment of the disclosure for an implementation of the display panel, so a repeated description thereof will be omitted here.

Based upon the same inventive idea, an embodiment of the disclosure further provides a display device including the display panel above. The display device can be a mobile phone, a tablet computer, a TV set, a displayer, a notebook computer, a digital camera, a navigator, a smart watch, a fitness wrist watch, a personal digital assistant, an automatic teller machine, or any other product or component with a display function. All the other components indispensable to the display device shall readily occur to those ordinarily skilled in the art, so a repeated description thereof will be omitted here, and the embodiments of the disclosure will not be limited thereto. Reference can be made to the implementation of the display panel above according to the embodiment of the disclosure for an implementation of the display device, so a repeated description thereof will be omitted here.

The embodiments of the disclosure provide the pixel compensation circuit, the method for driving the same, the display panel, and the display device as described above. The pixel compensation circuit includes: an initialization sub-circuit, a data writing sub-circuit, a storage sub-circuit, a compensation sub-circuit, a driving sub-circuit, a light-emission control sub-circuit, and a light-emitting element. The initialization sub-circuit has a first control terminal connected with a gate scan signal terminal, a second control terminal connected with a reset signal terminal, a first input terminal connected with a reference signal terminal, a second input terminal connected with an initialization signal terminal, a first output terminal connected with a first node, and a second output terminal connected with a second node, and the initialization sub-circuit is configured to write a signal of the reference signal terminal into the first node under the control of the gate scan signal terminal, and to write a signal of the initialization signal terminal into the second node under the control of the reset signal terminal; the data writing sub-circuit has a control terminal connected with the gate scan signal terminal, an input terminal connected with a data signal terminal, and an output terminal connected with the first node, and the data writing sub-circuit is configured to write a signal of the data signal terminal into the first node under the control of the gate scan signal terminal; the storage sub-circuit has one terminal connected with the first node, and the other terminal connected with the second node, and the storage sub-circuit is configured to write the difference between the signal of the reference signal terminal and the signal of the data signal terminal into the second node; the compensation sub-circuit has a control terminal connected with the gate scan signal terminal, a first terminal connected with a third node, and a second terminal connected with the second node, and the compensation sub-circuit is configured to write threshold voltage of the driver sub-circuit into the second node; and the driver sub-circuit has a control terminal connected with the second node, an input terminal connected with a first power supply terminal, and an output terminal connected with the third node; the light-emission control sub-circuit has a first control terminal connected with the gate scan signal terminal, a second control terminal connected with the reset signal terminal, an input terminal connected with the third node, and an output terminal connected with one terminal with the light-emitting element, and the light-emitting element has the other terminal connected with a second power supply terminal; and the driver sub-circuit is configured to drive the light-emitting element to emit light through the turned-on light-emission control sub-circuit, under the control of the second node. Since the sub-circuits can operate in cooperation with each other only under the control of the gate scan signal terminal and the reset signal terminal so that operating current of the light-emitting element isn't affected by the threshold voltage of the driver sub-circuit, so only a gate driver providing driver signals to the gate scan signal terminal and the reset signal terminal, but no light-emission controller are arranged at a border, thus resulting in a design of the narrow border. Furthermore only a gate scan signal line and a reset signal line, but no light-emission control signal line are designed accordingly, thus improving the resolution of the display panel.

It shall be noted that in this context, the relationship terms, e.g., "first", "second", etc., are only intended to distinguish one entity or operation from another entity or operation, but not intended to require or suggest any such a real relationship or order between these entities or operations.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel compensation circuit, comprising: an initialization sub-circuit, a data writing sub-circuit, a storage sub-circuit, a compensation sub-circuit, a driving sub-circuit, a light-emission control sub-circuit, and a light-emitting element, wherein:
   the initialization sub-circuit has a first control terminal connected with a gate scan signal terminal, a second control terminal connected with a reset signal terminal, a first input terminal connected with a reference signal terminal, a second input terminal connected with an initialization signal terminal, a first output terminal connected with a first node, and a second output terminal connected with a second node; and the initialization sub-circuit is configured to write a signal of the reference signal terminal into the first node under the control of the gate scan signal terminal, and to write a signal of the initialization signal terminal into the second node under the control of the reset signal terminal;
   the data writing sub-circuit has a control terminal connected with the gate scan signal terminal, an input terminal connected with a data signal terminal, and an output terminal connected with the first node; and the data writing sub-circuit is configured to write a signal of the data signal terminal into the first node under the control of the gate scan signal terminal;
   the storage sub-circuit has one terminal connected with the first node, and the other terminal connected with the second node; and the storage sub-circuit is configured to write a difference between the signal of the reference signal terminal and the signal of the data signal terminal into the second node;
   the compensation sub-circuit has a control terminal connected with the gate scan signal terminal, a first terminal connected with a third node, and a second terminal connected with the second node; and the compensation sub-circuit is configured to write a threshold voltage of the driver sub-circuit into the second node; and
   the driver sub-circuit has a control terminal connected with the second node, an input terminal connected with a first power supply terminal, and an output terminal connected with the third node; the light-emission control sub-circuit has a first control terminal connected with the gate scan signal terminal, a second control terminal connected with the reset signal terminal, an input terminal connected with the third node, and an output terminal connected with one terminal of the light-emitting element, and the light-emitting element has the other terminal connected with a second power supply terminal; and the driver sub-circuit is configured, under the control of the second node, to drive the light-emitting element to emit light through the light-emission control sub-circuit which is turned-on;
   wherein the initialization sub-circuit comprises: a first switch transistor and a second switch transistor, wherein:

the first switch transistor has a gate connected with the gate scan signal terminal, a first electrode connected with the reference signal terminal, and a second electrode connected with the first node, the first switch transistor is configured to write the signal of the reference signal terminal into the first node under the control of the gate scan signal terminal; and the second switch transistor has a gate connected with the reset signal terminal, a first electrode connected with the initialization signal terminal, and a second electrode connected with the second node, the second switch transistor is configured to write the signal of the initialization signal terminal into the second node under the control of the reset signal terminal;

wherein the initialization signal terminal is a different terminal from the first node.

2. The pixel compensation circuit according to claim 1, wherein the data writing sub-circuit comprises: a third switch transistor, wherein:

the third switch transistor has a gate connected with the gate scan signal terminal, a first electrode connected with the data signal terminal, and a second electrode connected with the first node.

3. The pixel compensation circuit according to claim 1, wherein the storage sub-circuit comprises: a capacitor, wherein:

the capacitor has one terminal connected with the first node, and the other terminal connected with the second node.

4. The pixel compensation circuit according to claim 1, wherein the compensation sub-circuit comprises: a fourth switch transistor, wherein:

the fourth switch transistor has a gate connected with the gate scan signal terminal, a first electrode connected with the third node, and a second electrode connected with the second node.

5. The pixel compensation circuit according to claim 1, wherein the driver sub-circuit comprises: a driver transistor, wherein:

the driver transistor has a gate connected with the second node, a first electrode connected with the first power supply terminal, and a second electrode connected with the third node.

6. The pixel compensation circuit according to claim 1, wherein the light-emission control sub-circuit comprises: a fifth switch transistor and a sixth switch transistor, wherein:

the fifth switch transistor has a gate connected with the gate scan signal terminal, a first electrode connected with the third node, and a second electrode connected with a first electrode of the sixth switch transistor; and the sixth switch transistor has a gate connected with the reset signal terminal, and a second electrode connected with one terminal of the light-emission element.

7. The pixel compensation circuit according to claim 1, wherein the first switch transistor, the fifth switch transistor, and the sixth switch transistor are N-type transistors, and the second switch transistor, the third switch transistor, the fourth switch transistor, and the driver transistor are P-type transistors;

or, the first switch transistor, the fifth switch transistor, and the sixth switch transistor are P-type transistors, and the second switch transistor, the third switch transistor, the fourth switch transistor, and the driver transistor are N-type transistors.

8. A display panel, comprising a gate driver, wherein the display panel further comprises the pixel compensation circuit according to claim 1.

9. A display device, comprising the display panel according to claim 8.

10. A method for driving the pixel compensation circuit according to claim 1, the method comprising:

in an initialization period, providing respectively, by the gate scan signal terminal and the reset signal terminal, the initialization sub-circuit with an enabling signal to enable the signal of the reference signal terminal to be written into the first node, and the signal of the initialization signal terminal to be written into the second node;

in a charging period, providing, by the gate scan signal terminal, the data writing sub-circuit and the compensation respectively with enabling signals so that the signal of the data signal terminal to be written into the first node, and the threshold voltage of the driver sub-circuit to be written into the second node; and in a light-emission period, providing, by the gate scan signal terminal, the initialization sub-circuit with an enabling signal to enable the signal of the reference signal terminal to be written into the first node; and providing respectively, by the gate scan signal terminal and the reset signal terminal, the light-emission control sub-circuit with an enabling signal to enable the light-emitting element to emit light.

* * * * *